(12) United States Patent
Kim et al.

(10) Patent No.: US 6,967,868 B2
(45) Date of Patent: Nov. 22, 2005

(54) SEMICONDUCTOR MEMORY DEVICE HAVING FLEXIBLE COLUMN REDUNDANCY SCHEME

(75) Inventors: In-Young Kim, Seoul (KR); June Lee, Seoul (KR); Oh-Suk Kwon, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/845,314

(22) Filed: May 14, 2004

(65) Prior Publication Data

US 2004/0240268 A1 Dec. 2, 2004

(30) Foreign Application Priority Data

May 28, 2003 (KR) ...................... 10-2003-0034119

(51) Int. Cl.[7] ............................................ G11C 11/34
(52) U.S. Cl. .............................. 365/185.09; 365/225.7
(58) Field of Search ......................... 365/185.09, 225.7

(56) References Cited

U.S. PATENT DOCUMENTS

| | | |
|---|---|---|
| 5,299,162 A | 3/1994 | Kim et al. |
| 5,671,178 A * | 9/1997 | Park et al. ............. 365/185.22 |
| 5,712,818 A | 1/1998 | Lee et al. |
| 5,761,132 A | 6/1998 | Kim et al. |
| 5,790,458 A | 8/1998 | Lee et al. |
| 5,963,488 A * | 10/1999 | Inoue ......................... 365/200 |
| 6,084,807 A | 7/2000 | Choi |
| 6,282,121 B1 | 8/2001 | Choi et al. |
| 6,304,501 B2 | 10/2001 | Ooishi |
| 6,813,184 B2 * | 11/2004 | Lee ........................ 365/185.09 |
| 6,865,099 B2 * | 3/2005 | Tran et al. ..................... 365/63 |

FOREIGN PATENT DOCUMENTS

| | | |
|---|---|---|
| JP | 11-102950 | 4/1999 |
| KR | 10-2001-0019340 | 3/2001 |

* cited by examiner

*Primary Examiner*—M. Tran
(74) *Attorney, Agent, or Firm*—Harness, Dickey & Pierce, P.L.C.

(57) ABSTRACT

A flash memory device may include: a plurality of main bit lines; a plurality of redundant bit lines; a plurality of first page buffers respectively organized as a plurality of first page buffer groups which are connected to main bit lines; a plurality of second page buffers respectively organized as a plurality of second page buffer groups which are connected to the redundant bit lines; each of the first and second page buffers including an output P/F terminal to provide pass/fail data; a plurality of fuses corresponding to the pluralities of the first and second page buffer groups, respectively, each of the fuses having one end commonly connected to the P/F terminals in a corresponding page buffer group and the other end connected to a signal line; and a pass/fail check circuit to determine an overall pass/fail signal based upon a signal on the signal line.

24 Claims, 14 Drawing Sheets

SEMICONDUCTOR MEMORY DEVICE HAVING FLEXIBLE COLUMN REDUNDANCY SCHEME

CROSS-REFERENCE TO RELATED APPLICATIONS

This U.S. nonprovisional patent application claims priority under 35 U.S.C. § 119 of Korean Patent Application 2003-34119 filed on May 28, 2003, the entire contents of which are hereby incorporated by reference.

BACKGROUND OF THE INVENTION

A NAND flash memory device, which is one example of a non-volatile semiconductor memory device, includes a page buffer circuit for performing various functions. For example, in reading data from memory cells of a selected page, the page buffer circuit senses data of the selected page and latches the sensed page data. In addition, when data are programmed in memory cells of the selected page, the page buffer circuit temporarily stores program data supplied from outside. The page buffer circuit is capable of preventing a program-inhibited cell or a program-completed cell from being programmed. Examples of the page buffer performing functions mentioned above are disclosed in U.S. Pat. No. 5,790,458 entitled "SENSE AMPLIFIER FOR NONVOLATILE SEMICONDUCTOR MEMORY DEVICE," U.S. Pat. No. 5,761,132 entitled "INTEGRATED CIRCUIT MEMORY DEVICE WITH LATCH-FREE PAGE BUFFERS THEREIN FOR PREVENTING READ FAILURE" and U.S. Pat. No. 5,712,818 entitled "DATA LOADING CIRCUIT FOR PARTIAL PROGRAM OF NONVOLATILE SEMICONDUCTOR MEMORY".

In performing a verification operation for confirming if programmed/erased cells have reached a target threshold voltage (if programmed/erased cells are sufficiently programmed/erased), the page buffer circuit, in the same way as a sensing operation, senses/latches data bits from memory cells of the selected page. To decide whether the latched data bits are pass data bits, the page buffer circuit provides the latched data bits to a program-status detecting circuit (also referred to as "a pass/fail check circuit") without otherwise outputting the data from the page buffer. A NAND flash memory device having the program-status detecting circuit is disclosed in U.S. Pat. No. 5,299,162 entitled "SEMICONDUCTOR MEMORY DEVICE AND AN OPTIMIZING PROGRAMMING METHOD THEREOF."

The program-status detecting circuit PS, which is disclosed in U.S. Pat. No. 5,299,162, includes pull-down transistors PD1–PD1024 connected to latches LT of page buffers PB, respectively. The pull-down transistors PD1–PD1024 are controlled by inversion outputs /Q of corresponding latches LT. Program/erase verification is carried out repeatedly until all pull-down transistors PD1–PD1024 are turned off.

After repeatedly performing the program/erase operation, a determination is made by the program status detection circuit whether all memory cells have been normally programmed/erased. Even after program/erase verification is carried out upon all effected memory cells, results of the pass/fail check circuit can indicate a program/erase failure. Such a program/erase failure may be generated, for example, by a defective memory cell. If the program/erase failure is caused by the defective memory cell, then the defective memory cell(s) is (are) substituted for redundant cell(s) in a known manner. After such substitution, a program/erase failure should not be indicated unless there was some additional cause of the failure.

SUMMARY OF THE INVENTION

At least one embodiment of the present invention provides a semiconductor memory device having a flexible column redundancy scheme that, e.g., can repair a defective page buffer without having to declare the corresponding column defective and/or can prevent a verification failure due to the defective page buffer.

At least one other embodiment of the present invention provides a flash memory device comprising: a plurality of main bit lines; a plurality of redundant bit lines; a plurality of first page buffers respectively organized as a plurality of first page buffer groups which are connected to main bit lines; a plurality of second page buffers respectively organized as a plurality of second page buffer groups which are connected to the redundant bit lines; each of the first and second page buffers including an output P/F terminal to provide pass/fail data; a plurality of fuses corresponding to the pluralities of the first and second page buffer groups, respectively, each of the fuses having one end commonly connected to the P/F terminals in a corresponding page buffer group and the other end connected to a signal line; and a pass/fail check circuit to determine an overall pass/fail signal based upon a signal on the signal line.

Additional features and advantages of the invention will be more fully apparent from the following detailed description of example embodiments, the accompanying drawings and the associated claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE INVENTION

Reference will now be made in detail to the preferred embodiments of the present invention, examples of which are illustrated in the accompanying drawings. However, the present invention is not limited to the embodiments illustrated herein after, and the embodiments herein are rather introduced to provide easy and complete understanding of the scope and spirit of the present invention.

In developing embodiments of the present invention, the following problem with the Background Art was recognized, the physics thereof determined, and the problem overcome. The program-status detecting circuit of U.S. Pat. No. 5,299,162 can exhibit a program/erase failure also because of a defective page buffer. If the page buffer is defective, at least one of pull-down transistors PD1–PD1024 of the program-status detecting circuit is turned on continuously. As a result, the output of the program-status detecting circuit will continuously exhibit the program/erase failure. This makes it difficult, e.g., in a situation where a defective memory cell has also caused the program/erase failure, to use absence of a program/erase failure as a confirmation that the defective memory cell has been replaced. At least one embodiment of the present invention solves such a problem by providing a semiconductor memory device which has a flexible column redundancy scheme that, e.g., can isolate a defective page buffer without having to declare the corresponding column defective.

Figure 1:
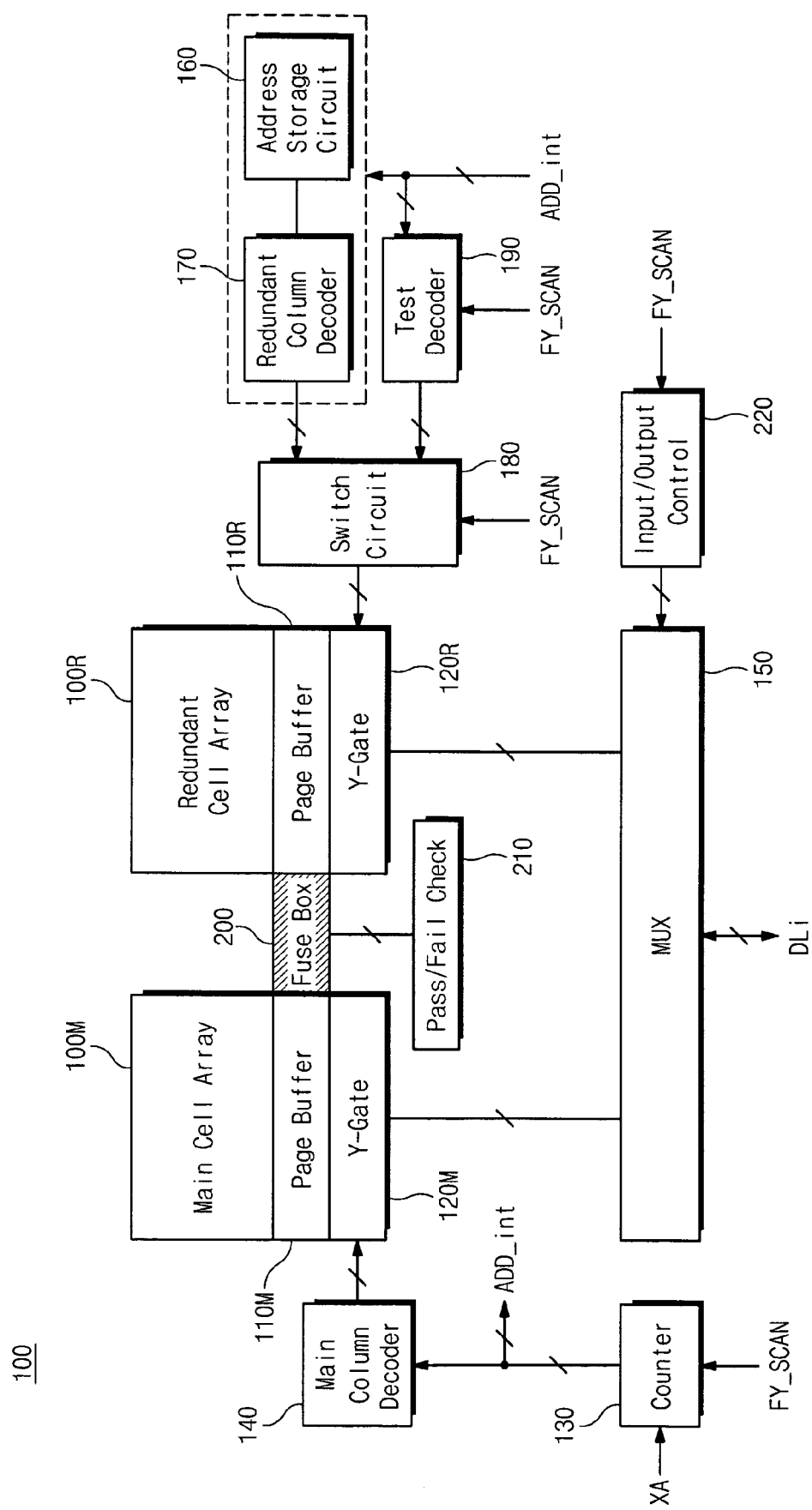
FIG. 1 is a block diagram showing a flash memory device according to at least one embodiment of the present invention.

FIG. 1 is a block diagram showing a flash memory device 100, according to at least one embodiment of the present invention.

Referring to FIG. 1, the flash memory device 100 includes an array comprising a main cell array 100M and a redundant cell array 100R. The main cell array 100M includes main columns (main bit lines), e.g., corresponding to a plurality of NAND strings (as is known), respectively. Each NAND string can include a string selection transistor, a ground selection transistor and main cells connected in series between the string selection transistor and the ground transistor. The redundant cell array 100R provides redundant columns that can be substituted for defective columns of the main cell array 100M and can include NAND strings respectively corresponding to redundant columns (redundant bit lines). It is to be understood that the columns of the redundant cell array 100R can be constituted of the same (or substantially the same) circuitry as those of the main cell array 100M. In effect, the redundant cell array 100R can make it seem as though a defective column has been repaired.

A page buffer circuit 110M senses data from the main cell array 100M through the main bit lines in a read operation. In addition, the page buffer circuit 110M drives the main bit lines to a level of a power supply voltage or a ground voltage depending on a program/erase operation. The page buffer circuit 110M includes a plurality of page buffers (not shown in FIG. 1 but see other figures) connected to the main bit lines respectively, and the page buffers are divided into a plurality of groups. A column gate circuit (referred to as "Y-Gate") 120M responds to selection signals from a main column decoder circuit 140 to sequentially select page buffers of the page buffer circuit 110M at a bite/word level of resolution within the circuit 110M. In a read operation, bite/word data of the selected page buffers are transferred through a multiplexer circuit 150 to data lines DLk. In a program operation, bite/word data that will be programmed on data lines DLk are loaded through the multiplexer circuit 150 and the column gate circuit 120M into the selected page buffers.

An address XA applied from the outside is loaded in a counter circuit 130. To select page buffers at the bite/word unit level, the counter circuit 130 sequentially increases loaded address to generate an internal address ADD_int. The main column decoder circuit 140 responds to the internal address ADD_int from the counter circuit 130 to generate selection signals. In a normal operation mode, the counter circuit 130 generates the internal address ADD_int to sequentially select main columns (page buffers of the page buffer circuit 110M) of the main cell array 100M. In test (also known as scan) operation mode, the data of all page buffers of page buffer circuits 110M and 110R are output for inspection, e.g., by a pass/fail check circuit 210. As is known, a scan flag signal can be used to indicate the test mode. When a scan flag signal FY_SCAN is activated, the counter circuit 130 generates the internal address ADD_int to sequentially select main columns (page buffers of the page buffer circuit 110M) of the main cell array 100M as well as redundant columns (page buffers of the page buffer circuit 110R) of the redundant cell array 100R.

Similarly, referring to FIG. 1, the page buffer circuit 110R senses data from the redundant cell array 100R through redundant bit line(s) in a read operation. In addition, the page buffer circuit 110R drives redundant bit line(s) to a level of the power supply voltage or the ground voltage depending on a program/erase operation. The page buffer circuit 110R includes a plurality of page buffers (not shown in FIG. 1 but see other figures) respectively connected to redundant bit lines. The column gate circuit (referred to as "Y-Gate") 120R responds to selection signals from a switch circuit 180 to select a page buffer of the page buffer circuit 110R. In a reading operation, instead of data of the defective column in the page buffer circuit 110M, data of the corresponding selected page buffer in page buffer circuit 110R is transferred through the multiplexer circuit 150 to the data line DLk. In a program operation, data to be programmed corresponding to the defective column in the page buffer circuit 110M is loaded through the multiplexer circuit 150 and the column gate circuit 120R into the corresponding selected page buffer in the page buffer circuit 110R.

The multiplexer circuit 150 operates responsive to an output from an input/output control circuit 220. For example, when an applied address (an output address of the counter circuit) is an address of a defective column in the page buffer circuit 110M, the multiplexer circuit 150 selects a corresponding replacement column in the page buffer circuit 110R via the column gate circuit 120R rather than the defective column of the page buffer circuit 110R via the column gate circuit 120M. To the contrary, when the applied address is not an address of a defective column, the multiplexer circuit 150 selects desired ones among the outputs of the column gate circuit 120M and connects them to the corresponding data lines.

An address storage circuit 160 stores address(es) of (or, in other words pointers to) main column(s) in the page buffer circuit 110M. Furthermore, the address storage circuit 160 stores address(es) for pointing to the page buffer group that includes a defective page buffer. This will be more fully described later. A redundant column decoder circuit 170 responds to the output of the address storage circuit 160 and the internal address ADD_int to generate selection signals. The selection signals from the redundant column decoder 170 are transferred through the switch circuit 180 to the column gate circuit 120R. A test decoder circuit 190 operates responsive to the scan flag signal FY_SCAN, and generates selection signals by decoding the internal address ADD_int.

The selection signals from the test decoder circuit 190 are transferred through the switch circuit 180 to the column gate circuit 120R. The switch circuit 180 operates responsively to the scan flag signal FY_SCAN. For example, when the scan flag signal FY_SCAN is activated, the switch circuit 180 transfers an output of the redundant column decoder circuit 170 to the column gate circuit 120R. When the scan flag signal FY_SCAN is activated, the switch circuit 180 transfers an output of the test decoder circuit 190 to the column gate circuit 120R.

As shown in FIG. 1, the flash memory device 100 further includes a fuse box 200 and a pass/fail check circuit 210. The fuse box 200 transfers pass/fail data outputted from page buffer groups of the page buffer circuit 110M and 110R to the pass/fail check circuit 210. The pass/fail check circuit 210 decides whether or not a current program/erase operation has been normally carried out according to inputted data. If at least one of the page buffers in a page buffer group is defective, the fuse box 200 can electrically isolate the page buffer group that includes the defective page buffer from the pass/fail check circuit 210. This will be more fully described later.

Figure 2:
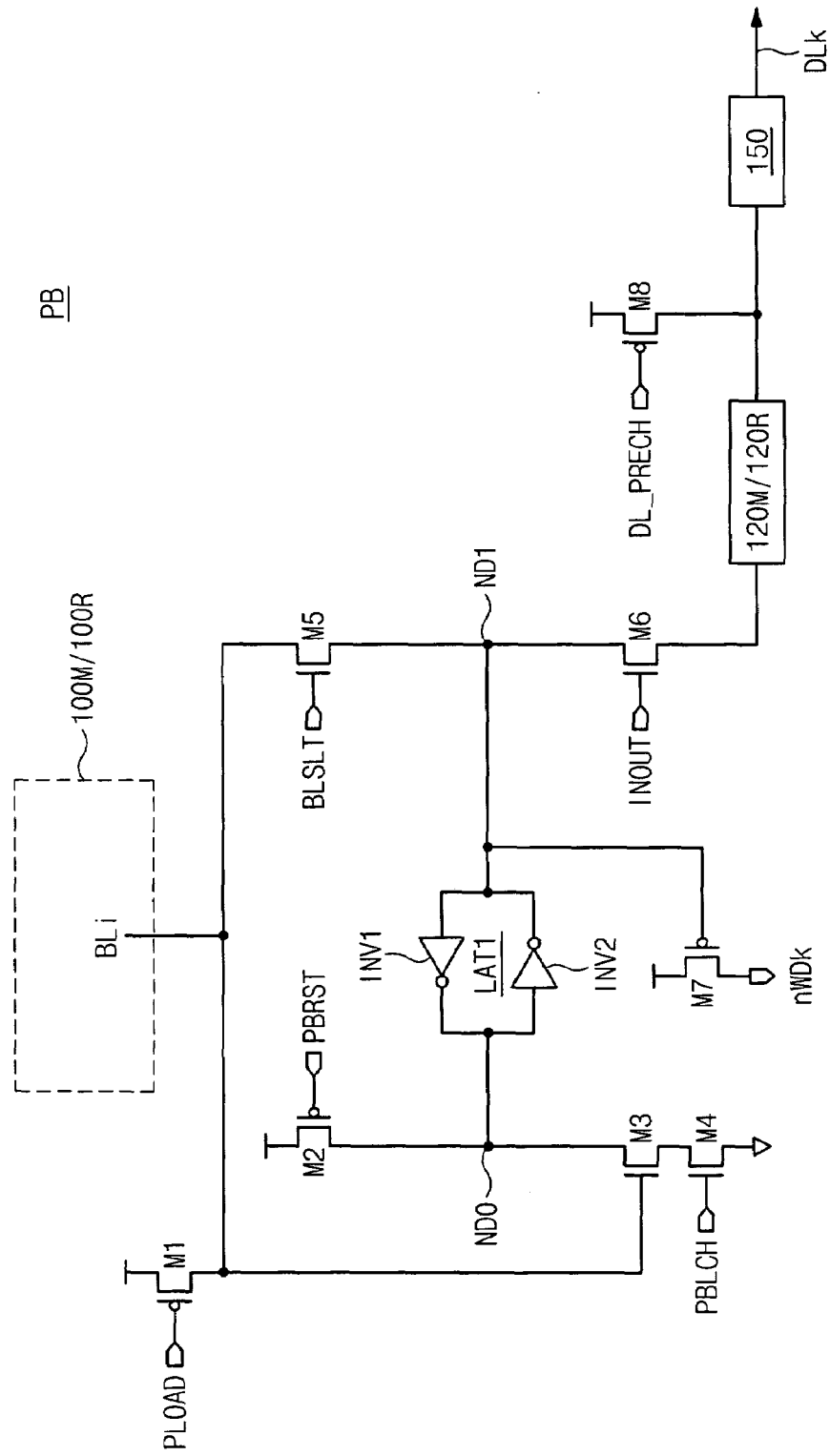
FIG. 2 is a circuit diagram for any one of page buffer circuits 110M and 110R in FIG. 1, according to at least one embodiment of the present invention.

FIG. 2 is a circuit diagram showing any one of the page buffers of the page buffer circuits 110M and 110R shown in FIG. 1, according to at least one embodiment of the present invention.

In FIG. 2, a page buffer PB is illustrated which is connected to only one main/redundant bit line, respectively, but the other page buffers connected to the respective other main/redundant bit lines may be constituted of the same (or substantially the same) circuitry as that shown in FIG. 2. Referring to FIG. 2, the page buffer PB includes three PMOS transistors M1, M2 and M7, four NMOS transistors M3, M4, M5 and M6, and a latch LAT1 comprising invertors INV1 and INV2, which can be connected as shown in FIG. 2. A bit line BLi (or, in other words, an $i^{th}$ column) of the main call array 100R or redundant call array 100R is connected to the transistors M1 and M5. The operation of page buffers is generally known. Hence, further description of the page buffer BP is kept brief.

Referring to FIG. 2, during operation of the page buffer BP, the PMOS transistor M7 selectively charges a signal line segment nWDk with a power supply voltage according to a logic level of a node ND1 of the latch LAT1. The signal line segment nWDk is precharged through the pass/fail check circuit 210 in FIG. 1 to a ground voltage level. A logic low level on the signal line segment nWDk indicates that a memory cell connected to the page buffer PB has been normally programmed/erased. To the contrary, a logic high level on the signal line segment nWDk exhibits that the memory cell connected to the page buffer PB has not been sufficiently programmed/erased.

Figure 3:
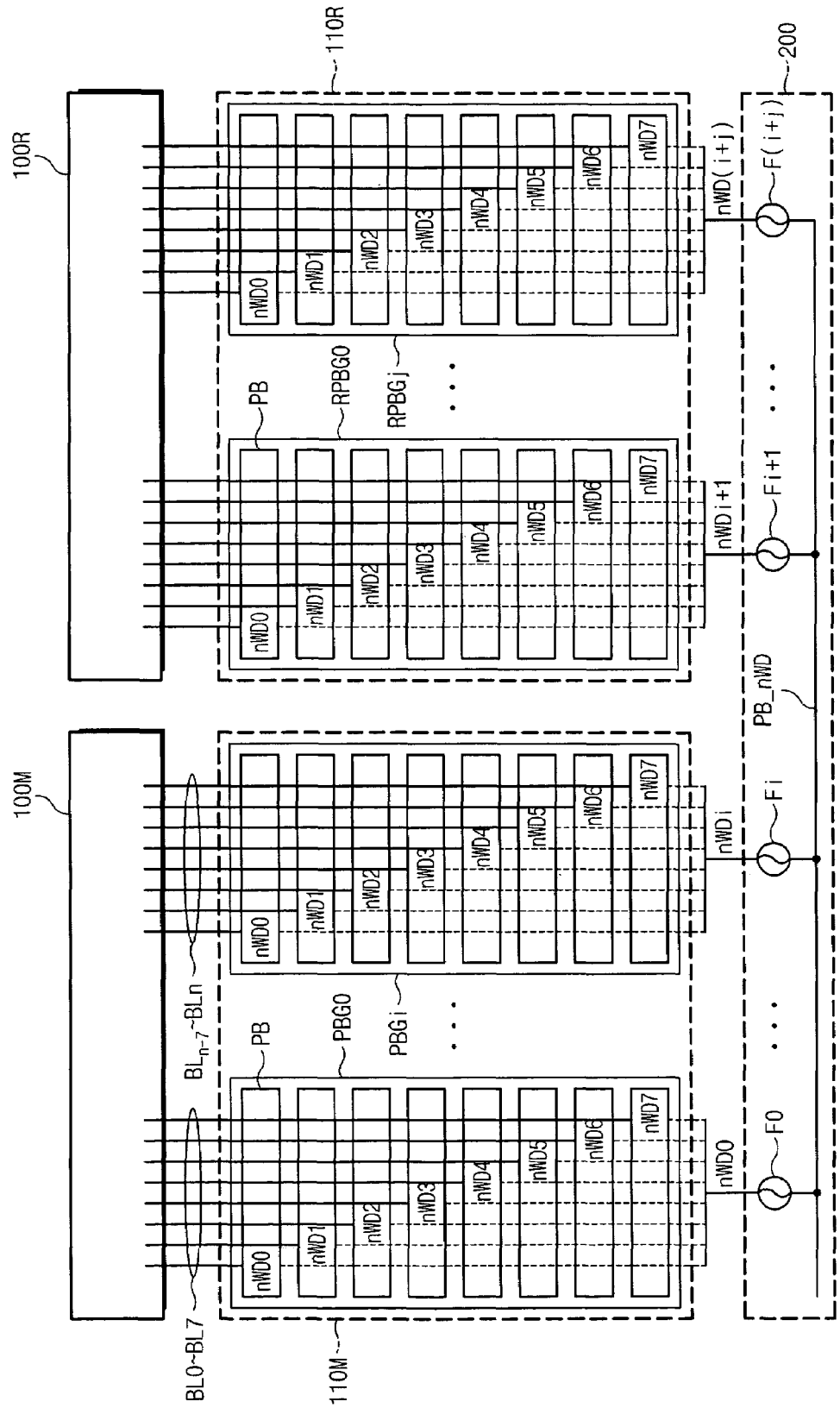
FIG. 3 shows a fuse circuit and the page buffer circuits in FIG. 1, according to at least one embodiment of the present invention.

FIG. 3 is a more detailed block diagram of the fuse circuit 200 and the page buffer circuits 100M and 100R of FIG. 1, according to at least one embodiment of the present invention.

Referring to FIG. 3, the page buffer circuit 110M includes a plurality of page buffer groups PBG0-PBGi. Each page buffer group PBG0–PBGi, for example, can have eight page buffers PB. As shown in FIG. 3, one page buffer can be arranged (or laid out) within the width of eight bit lines. For this reason, eight page buffers PB should be arranged perpendicularly to a bit line direction. PMOS transistors M7 of the page buffers PB in each page buffer group PBGk are commonly connected to a corresponding signal line segment nWDk, and the signal line segment nWDk is electrically connected through a corresponding fuse Fk to the signal line PB_nWD. For example, PMOS transistors M7 of the page buffers PB of a page buffer group PBG0 are commonly connected to the signal line segment nWD0, which is connected through a fuse F0 to the signal line PB_nWD.

Similarly, referring to FIG. 3, the page buffer circuit 110R includes a plurality of page buffer groups RPBG0–RPBGj. Each page buffer group RPBGi, for example, can have eight page buffers PB. One page buffer can be arranged within the width of eight bit lines, and so eight page buffers PB should be arranged perpendicularly to a bit line direction. PMOS transistors M7 of the page buffers PB in each page buffer group RPBGk are commonly connected to a corresponding signal line segment nWDk, which is electrically connected through a corresponding fuse Fk to the signal line PB_nWD. For example, PMOS transistors M7 in page buffers PB of a page buffer group RPBG0 are commonly connected to the signal line segment nWDi+1, which is connected through a fuse Fi+1 to the signal line PB_nWD.

In FIG. 3, fuses –F0–Fi+j are included as parts of the fuse circuit 200. For example, each fuse Fk may be a laser fuse.

If any main column of the main cell array 100M is determined to be defective, then a redundant column of the redundant cell array 100R may be substituted for it, which will be more fully described later. If a page buffer PB in any page buffer group PBGK is determined to be defective, the page buffer group PBGK that includes the defective page buffer PB may be electrically separated from the signal line PB_nWD by cutting (or, in other words, destroying) a corresponding fuse. For example, if a defective page buffer exists in the page buffer group PBG0, a fuse F0 corresponding to the page buffer group PBG0 can be cut. Once the fuse Fk is cut, the respective page buffer group PBGK is rendered completely irrelevant to a program/erase verify operation. In other words, the defective page buffer group PBGK will have no influence upon the results of the pass/fail check circuit 210 once the fuse Fk has been cut. The defective page buffer group PBGK may be substituted with a page buffer group of the redundant cell array 100R, which will be described more fully later.

Figure 4:
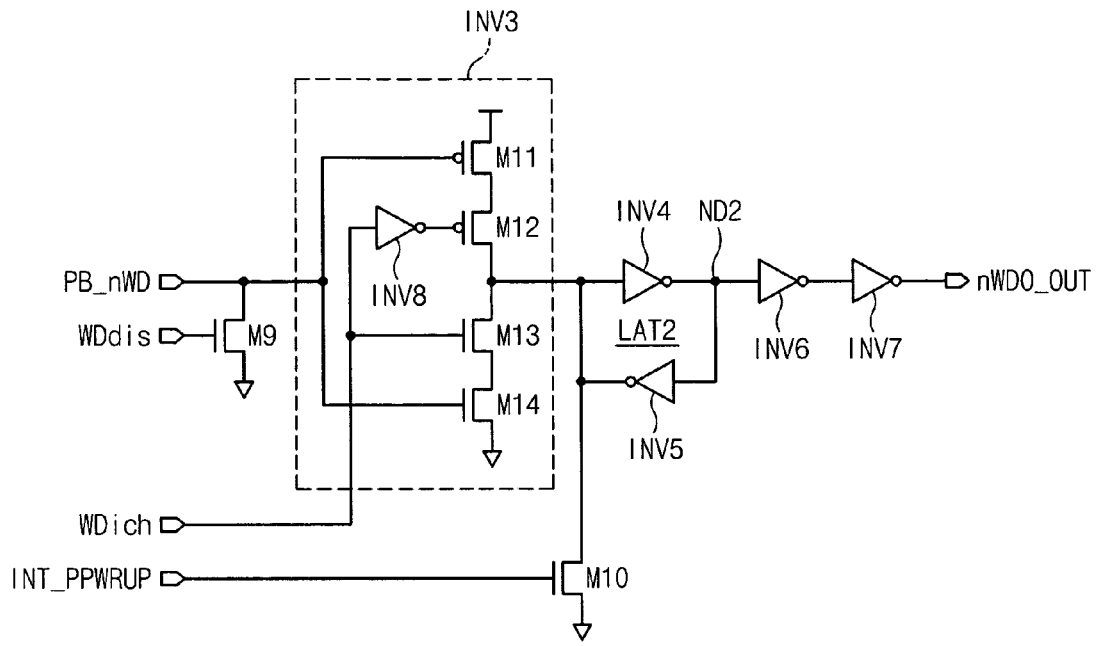
FIG. 4 is a circuit diagram for a pass/fail check circuit in FIG. 1 in accordance with at least one embodiment of the present invention.
Figure 5:
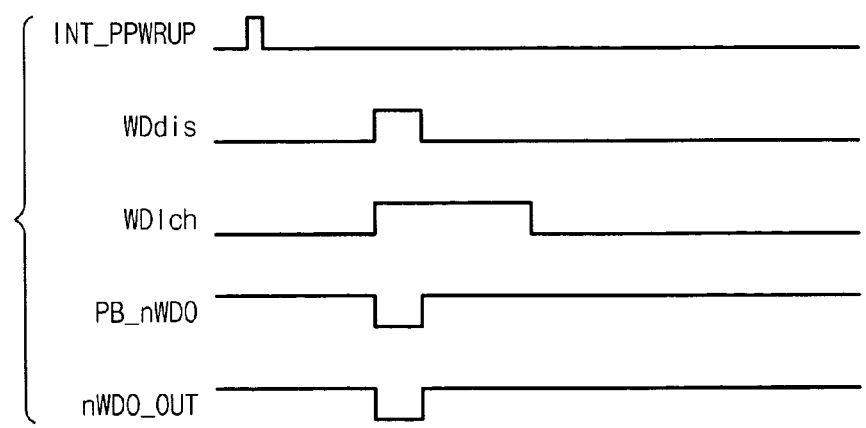
FIG. 5 is a timing diagram illustrating operation of the pass/fail check circuit in FIG. 4.

FIG. 4 is a circuit diagram showing in more detail the pass/fail check circuit 210 of FIG. 1, according to at least one embodiment of the present invention. FIG. 5 is a timing diagram illustrating an operation of the pass/fail check circuit 210 of FIG. 4.

As shown in FIG. 4, the pass/fail check circuit 210 includes a tri-state inverter INV3, NMOS transistors M9 and M10 and inverters INV4–INV7, which can be connected as shown in FIG. 4. Inverters INV4–INV5 are included as parts of a latch LAT2. In FIG. 5, when a control signal INT_PPWRRUP is activated in a pulse shape, a signal (not show in FIG. 5) on an output node ND2 of the latch LAT2 is initialized to a logic high level. When the control signal is activated, the signal line PB_nWD (from the fuse box 200) is set to a logic low level, e.g., at ground voltage, through the NMOS transistors M9. While a control signal WD1ch is activated high, a logic state of the signal line PB_nWD is latched to the latch LAT2. The latched signal may be outputted through the inverters INV6 and INV7, where the output of the inverter INV7 represents the scan flag signal FY_SCAN. When at the low level the scan flag signal FY_SCAN indicates that the present program/erase operation has been normally carried out (no failure). When at the high level the scan flag signal FY_SCAN indicates that the present program/erase operation has not been carried out normally (one or more causes of failure exist).

Figure 6:
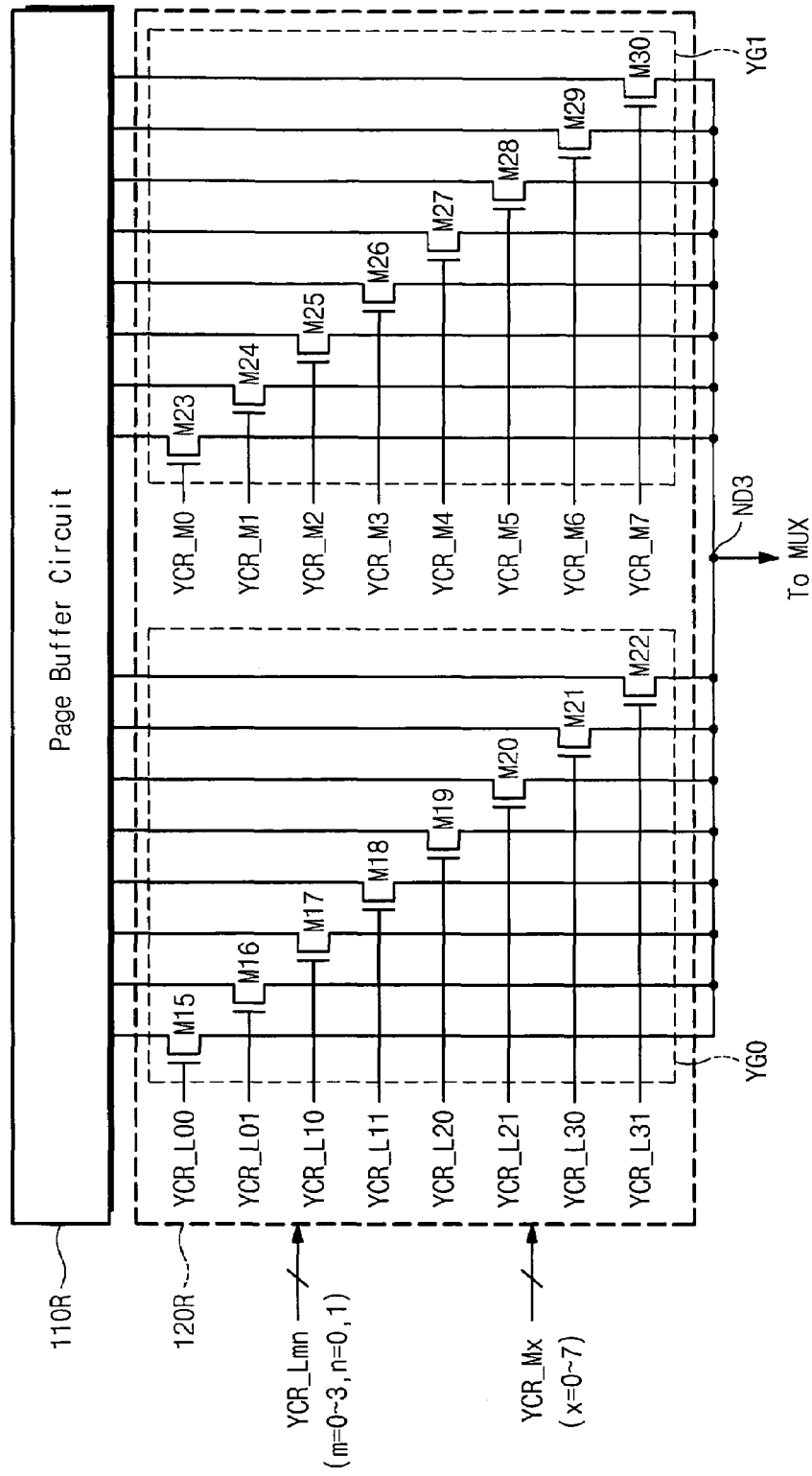
FIG. 6 is a circuit diagram for a column gate circuit 120R in FIG. 1, in accordance with at least one embodiment of the present invention.

FIG. 6 is a circuit diagram of the column gate circuit 120R of FIG. 1, according to at least one embodiment of the present invention.

Referring to FIG. 6, the column gate circuit 120R is operated by responding to selection signals YCR_Lmn and YCR_Mx (in this embodiment, it is assumed for simplicity of illustration/discussion that m=0–3, n=0–1 and x=0–7; other values of m, n and x can be implemented) received via the switch circuit 180 of FIG. 1, and includes a plurality of pass transistors M15–M30. The pass transistors M15–M22 are included as parts of a column gate unit YG0, and pass transistors M23–M30 are included as parts of a column gate unit YG1.

In FIG. 6, again for simplicity of illustration/discussion, it is assumed that page buffer circuit 100R has only two page buffer groups (though other numbers of such groups can be implemented), to which the column gate units YG0 and YG1 respectively correspond. Like the page buffer circuit 110M, each page buffer group of the page buffer circuit 110R, as previously mentioned, has eight page buffers PB respectively connected to eight bit lines. Drain terminals of the pass transistors M15–M22 are connected to the corresponding page buffers PB, respectively. In addition, source terminals of the pass transistors M15–M22 are commonly connected to a node ND3. The node ND3 (and the signal thereon, referred to as redundant data RD) is connected in common to one input terminal of each multiplexer of a multiplexer circuit 150, which will be more fully described hereinafter.

According to at least one embodiment of the present invention, when a main column is defective, redundant columns are substituted for the defective main column and a main column adjacent thereto. In other words, when one main column is defective, two main columns are replaced with redundant columns. Furthermore, a page buffer group that includes a defective page buffer (hereinafter inclusively referred to as a defective page buffer group), as previously mentioned, can be rendered completely irrelevant to the signal line PB_nWD. The defective page buffer group of the page buffer circuit 110M is replaced with a corresponding page buffer group of the page buffer circuit 110R. In other words, a flash memory device according to at least one embodiment of the present invention is capable of seeming to repair defective columns as well as the defective page buffer groups. In the Y-Gate circuit 120R of FIG. 6, the column gate unit YG0 is available to substitute redundant columns for defective main columns, and the column gate unit YG1 is available to substitute a redundant page buffer group for a defective page buffer group, as will be more fully described hereinafter.

If the circumstances of there being a defective main column arises, an address of the defective main column is stored in an address storage circuit 160 of FIG. 1. At this time, redundant columns are substituted for the defective main column and a main column adjacent thereto. Any one of the substituted redundant columns is selected at a normal read/program operation. For example, if redundant columns having respective pass transistors M15 and M16 are used to substitute for defective main columns, only one of selection signals YCR_L00 and YCR_L01 is activated and the other is inactivated. Residual pairs of pass transistors M17 and M18, M19 and M20, and M21 and M22 may be controlled in the same way as the previously mentioned method. Therefore, if the defective page buffer group arises, a fuse connected to the defective page buffer group is cut. The address of the defective page buffer group is stored in the address storage circuit 160 of FIG. 1. As a result, the defective page buffer group in the page buffer circuit 110M is substituted for by a corresponding page buffer group in the page buffer circuit 120R to support a read/program operation. Any one among the redundant columns of the substituted buffer group is selected through the column gate unit YG1. For example, in a normal read/program operation, only one of the selection signals YCR_MO–YCR_M7 is activated, and the others are inactivated.

Figure 7:
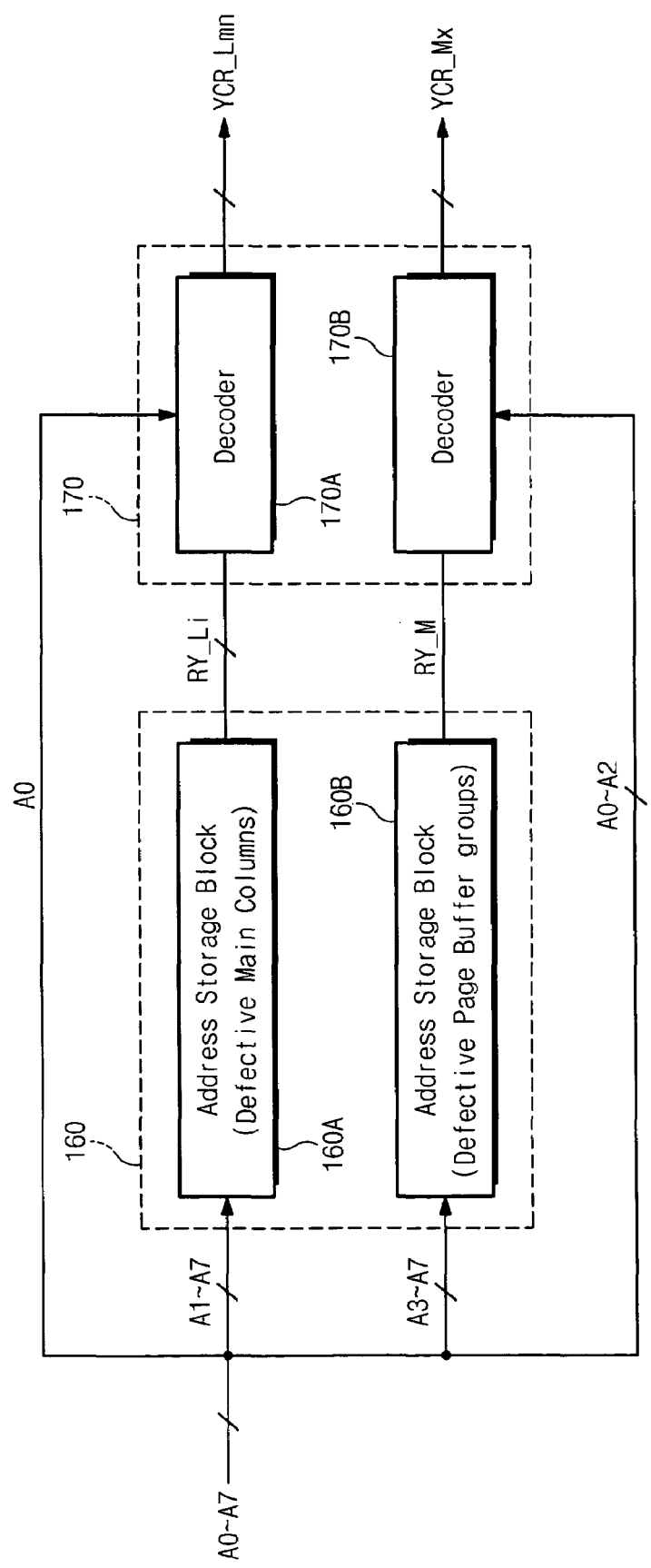
FIG. 7 is a block diagram showing an address storage circuit and a redundant column decoder circuit, in accordance with at least one embodiment of the present invention.

FIG. 7 is a block diagram showing in more detail the address storage circuit 160 and the redundant column decoder circuit 170 in FIG. 1, according to at least one embodiment of the present invention.

Referring to FIG. 7, the address storage circuit 160 includes two address storage blocks 160A and 160B, and the redundant column decoder 170A includes two redundant column decoders 170A and 170B. The address storage block 160A stores an address of a defective main column, and the address storage block 160B stores an address of a defective page buffer group. If the address (A1–A7) input to block 160A is consistent with the address stored therein, then the address storage block 160A activates any one of redundant enable signals RY_Li (in this embodiment, it is assumed for simplicity of illustration/discussion that i=0~3; other values of i can be implemented). If the input address (A3–A7) is consistent with the stored address, the address storage block 160B activates the redundant enable signal RY_M. The redundant column decoder circuit 170 comprises two redundant column decoders 170A and 170B. The redundant column decoder 170A receives the redundant enable signal RY_Li and the address signal A0. When any one of the redundant enable signals RY_Li is activated, the redundant column decoder 170A activates any one of selection signals YCR_Lmn according to the address signal A0. The redundant column decoder 170B receives the redundant column enable signal RY_M and address signals A0–A2. When the redundant enable signal RY_M is activated, the redundant column decoder 170B activates any one of selection signals YCR_Mx according to address signals A0–A2.

Figure 8:
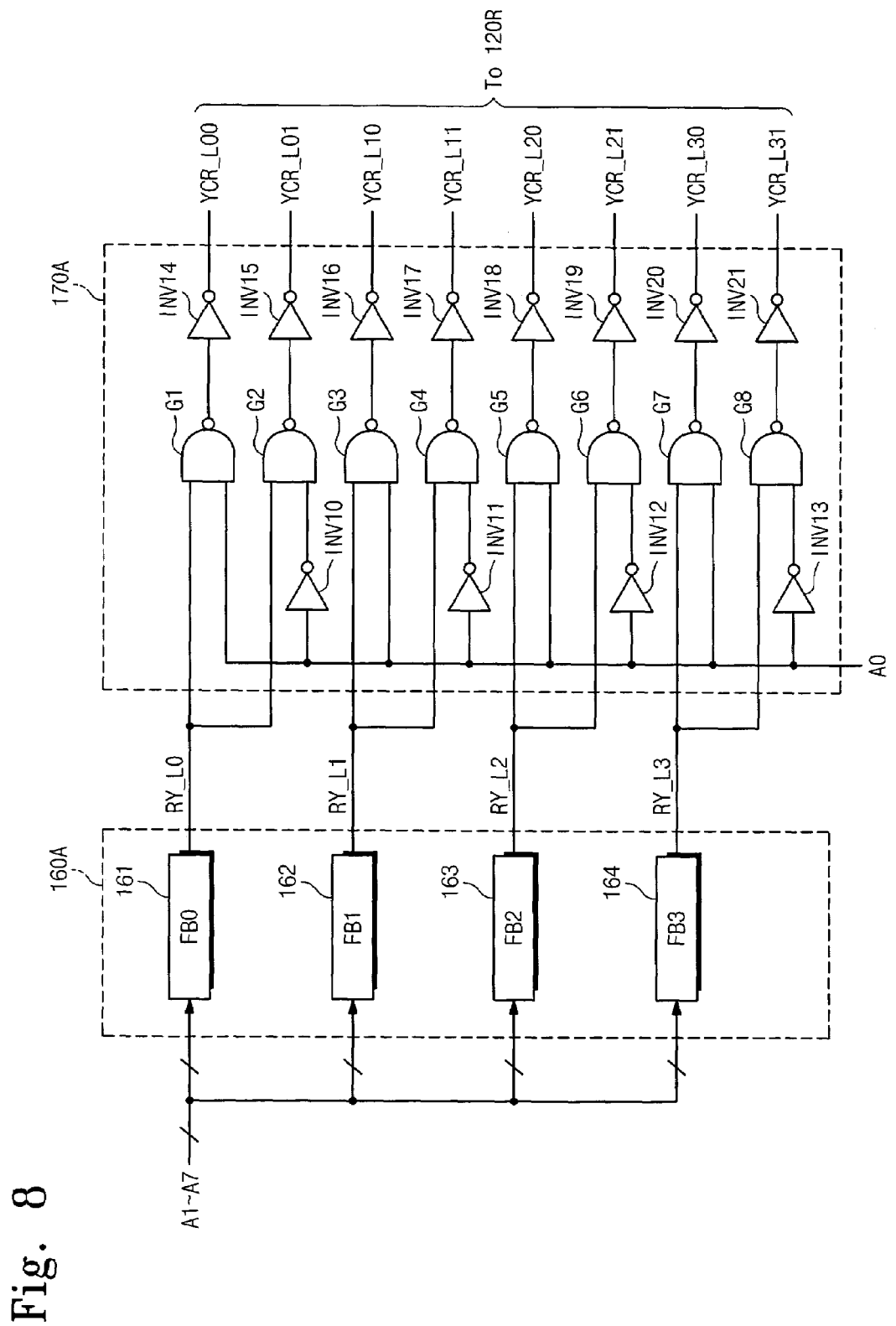
FIG. 8 is a circuit diagram for an address storage block 160A and the redundant decoder circuit 170B, according to at least one embodiment of the present invention.
Figure 9:
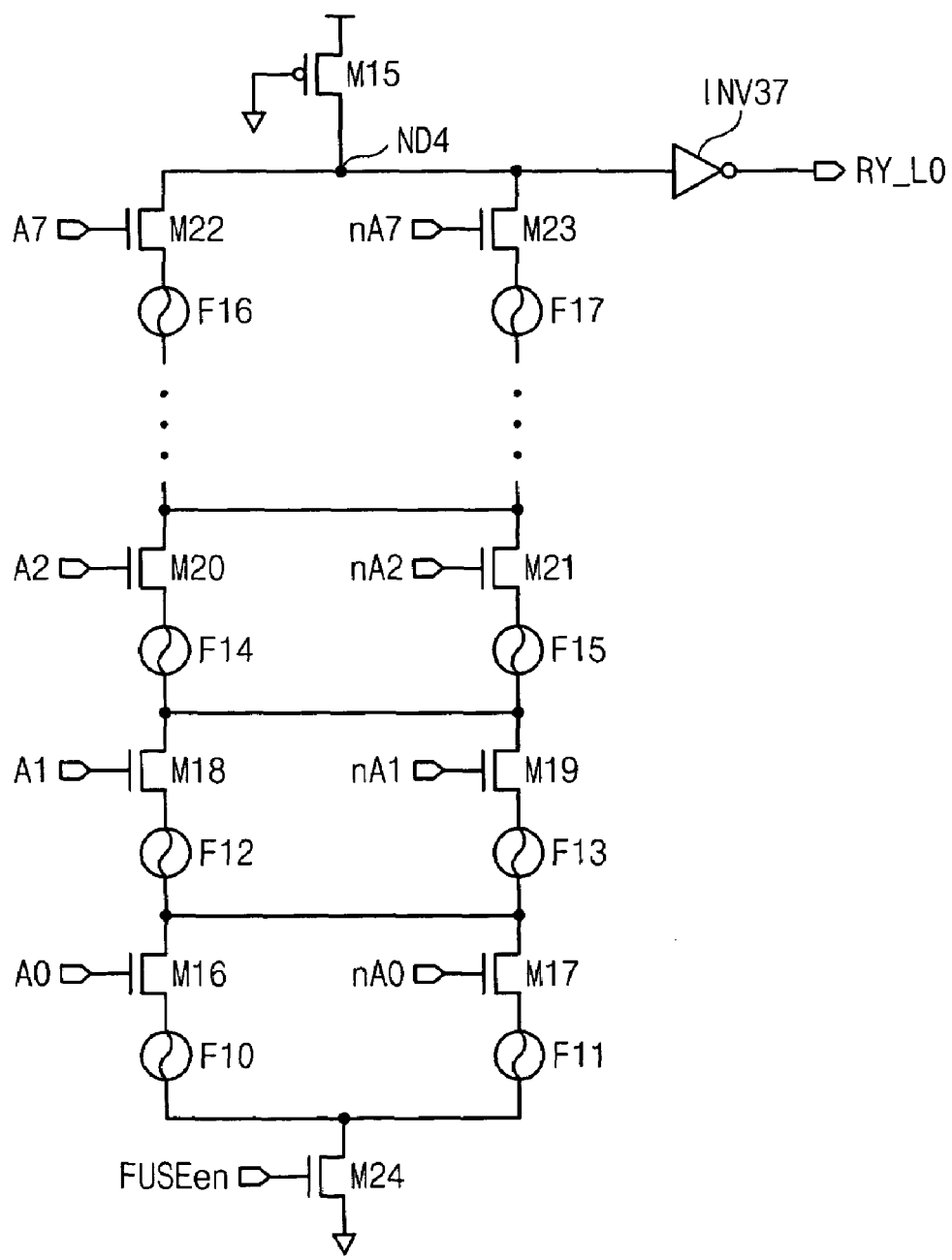
FIG. 9 is a circuit diagram showing any one of the fuse boxes in FIG. 8, in accordance with at least one embodiment of the present invention.

FIG. 8 is a circuit diagram showing in more detail the address storage block 160A and the redundant column decoder 170A in FIG. 7, according to at least one embodiment of the present invention. FIG. 9 is a circuit diagram for any one of fuse boxes 161–164 of FIG. 8, according to at least one embodiment of the present invention.

Referring to FIG. 8, the address storage block 160A includes four fuse boxes 161, 162, 163 and 164. Each fuse box 161–164 stores an address of a defective main column.

Each fuse box 161–164 activates a corresponding redundant enable signal when the input address A1–A7 is consistent with the address stored therein. As shown in FIG. 9, the fuse box, e.g., 161, comprises a plurality of transistors M15–M24, a plurality of fuses (e.g., laser fuses) F10–F17 and an inverter INV37, which can be connected as shown in the FIG. The other fuse boxes 162–164 are constituted of the same (or substantially the same) circuitry as shown in FIG. 9, and hence further description is omitted.

In this embodiment, since substitutions for two neighboring main columns are made using redundant columns simultaneously, only a 7-bit address needs to be stored in a fuse box. For this reason, fuses F10 and F11 related with a LSB address bit are not cut. If main columns are repaired by one column unit, an 8-bit address may be stored in a fuse box. In this case, fuses F10 and F11 related with an. LSB address bit A0 also would be selectively cut.

To store an address of a defective main column, fuses F10 and F11 may be cut selectively to form a current path between a node ND4 and the ground voltage. For example, if an address A1–A7 of the defective main column is "1111111", fuses F13, F15, . . . , F17 that are related with complementary address signals nA1-nA7 are cut, and fuses F12, F14, . . . , F16 that related with address signals A1–A7 are not cut. In this case, a current path between transistors M15 and M24 is formed only if an address of "1111111" is inputted. As a result, a flag signal RY_L0 is activated high.

Referring to FIG. 8 again, the redundant column decoder 170A includes a plurality of NAND gates (G1–G8) and a plurality of inverters (INV8–INV19), which can be connected as shown in FIG. 8. The redundant column decoder 170A responds to output signals RY_L0–RY_L3 of the address storage block 160A and the address signal A0 to activate any one of selection signals YCR_L00–YCR_L31. For example, if the redundant enable signal RY_L0 is activated and the address signal A0 is "0", the selection signal YCR_L01 is activated. Resultantly, the pass transistor M16 of the column gate unit YG0 of FIG. 6 becomes turned on. When the redundant enable signal RY_L0 is activated and the address signal A0 is "1", the selection signal YCR_L00 is activated. Therefore, the pass transistor M15 of the column gate unit TG0 becomes turned on.

Figure 10:
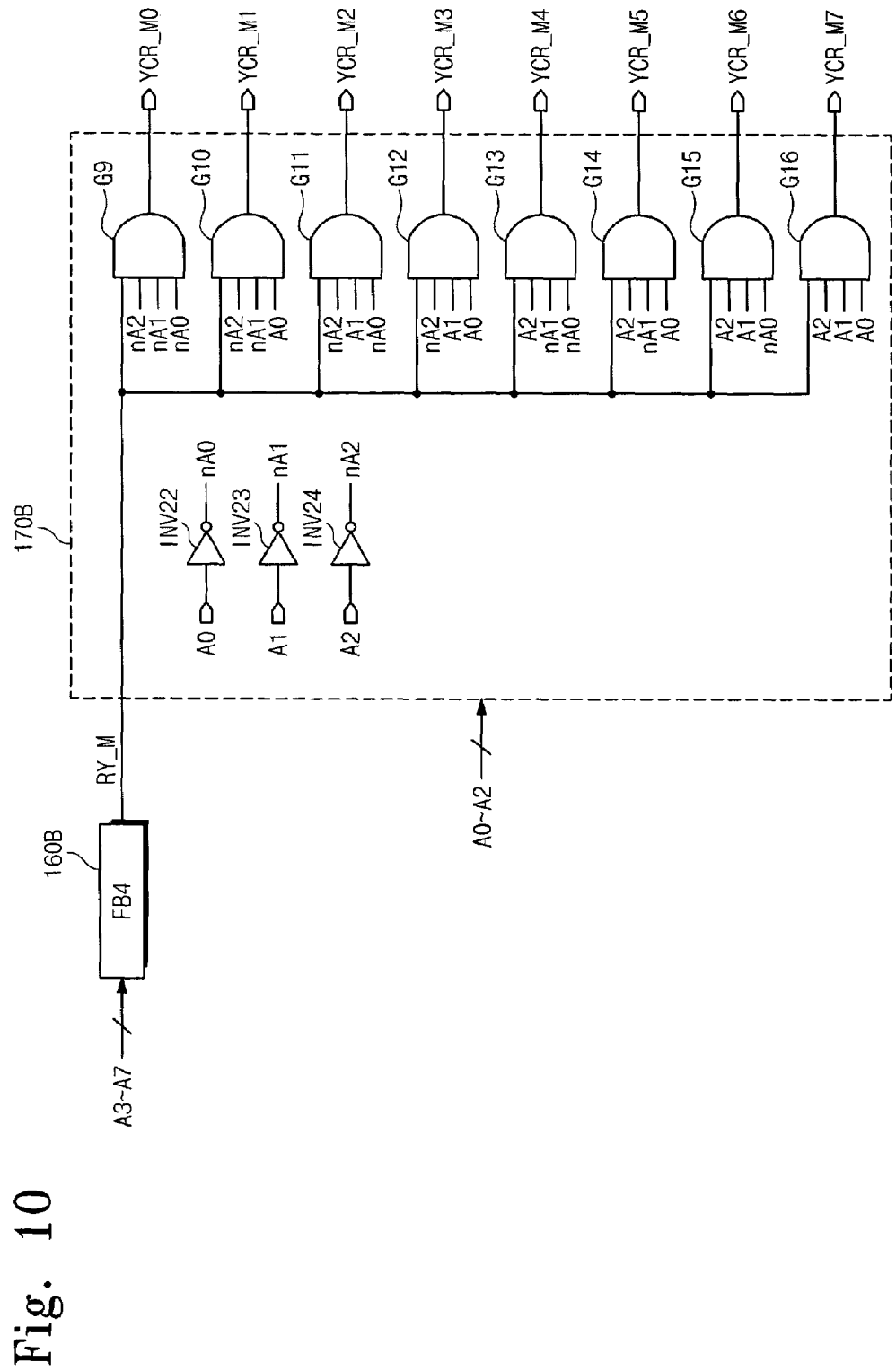
FIG. 10 is a circuit diagram for showing the address storage block 160B and the redundant decoder 170B in FIG. 7, in accordance with at least one embodiment of the present invention.

FIG. 10 is a circuit diagram for the address storage block 160B and the redundant column decoder 170B in FIG. 7, according to at least one embodiment of the present invention.

Referring to FIG. 10, the address storage block 160B stores an address of the defective page buffer group. In addition, if the address A3–A7 input to block 160B is consistent with the address stored therein, then the address storage block 160B activates the redundant enable signal RY_M. The address storage block 160B can include the circuit arrangement shown in FIG. 9, and stores a 5-bit address A3–A7. For this reason, fuses related with lower address signals A0–A2 are not cut. If the page buffer is laid out within a width in which 16 bit lines are arranged, the address storage block 160B stores a 4-bit address A4–A7, and fuses related with the lower address signals A0–A3 are not cut irrespective of an address that will be stored.

The redundant column decoder 170B includes AND gates G9–G16 and inverters INV22–INV24, which can be connected as shown in FIG. 10. When the redundant enable signal RY_M is activated and the address signals A0–A2 are "000", the output signal YCR_M7 of the AND gate G16 is activated. Therefore, the pass transistor M30 of the column gate unit YG1 of FIG. 6 becomes turned on. When the redundant enable signal RY_M is activated, and address signals A0–A2 are "111", the output signal YCR_MO of the AND gate G9 is activated. Resultantly, the pass transistors M23 of the column gate unit of FIG. 6 becomes turned on.

Figure 11:
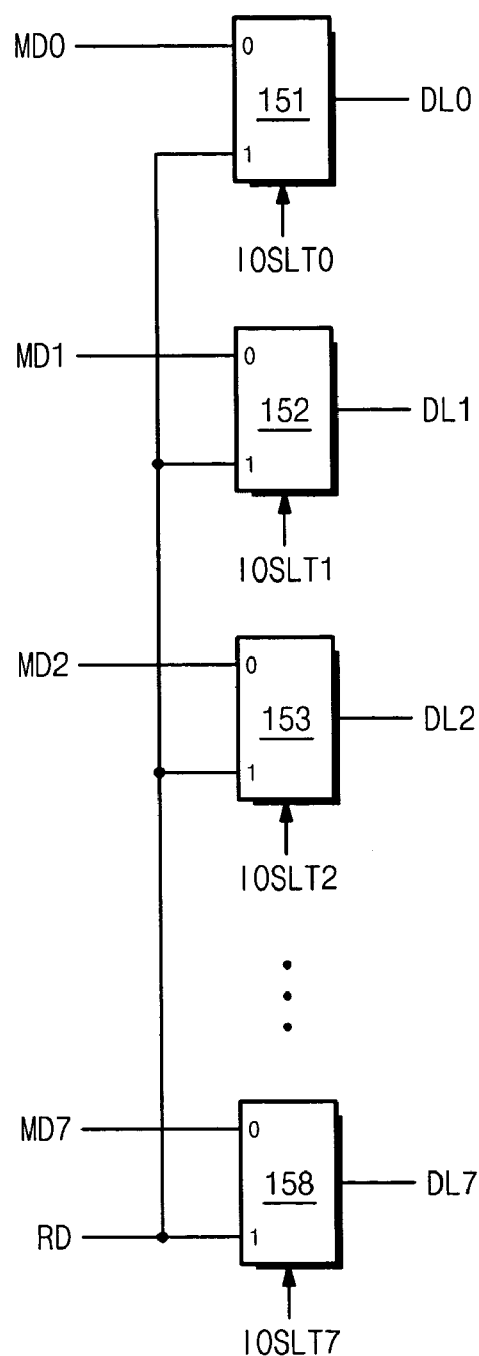
FIG. 11 is a block diagram showing a multiplexer circuit 159 in FIG. 1, in accordance with at least one embodiment of the present invention.

FIG. 11 is a block diagram showing the multiplexer circuit 150 of FIG. 1, according to at least one embodiment of the present invention.

Referring to FIG. 11, the multiplexer circuit 150 according to the present invention includes a plurality of multiplexers (e.g., eight multiplexers 151, 152, 153, . . . , 158). Each multiplexer 151–158 has two input terminals, one selection terminal and one output terminal. Corresponding selection signals IOSLT0–IOSLT7 are applied to the selection terminals of the multiplexers 151–158, respectively. Corresponding main data MD0–MD7 are supplied to first input terminals of the multiplexers 151–158, and redundant data RD (which is the signal on node ND3, as noted above) is commonly supplied to second input terminals of the multiplexers 151–158. When selection signals IOSLT0–IOSLY7 have a low level, multiplexers 151–158 select the main data. When any one of selection signals IOSLT0–IOSLT7 has a high level, a multiplexer that corresponds to the activated selection signal selects the redundant data rather than the main data, while the rest of multiplexers select the main data. For example, when a selection signal IOSLT0 is activated high, a multiplexer 151 selects the redundant data RD rather than the main data MD0, and the rest of multiplexers 151–158 select corresponding main data MD1–MD7.

Figure 12:
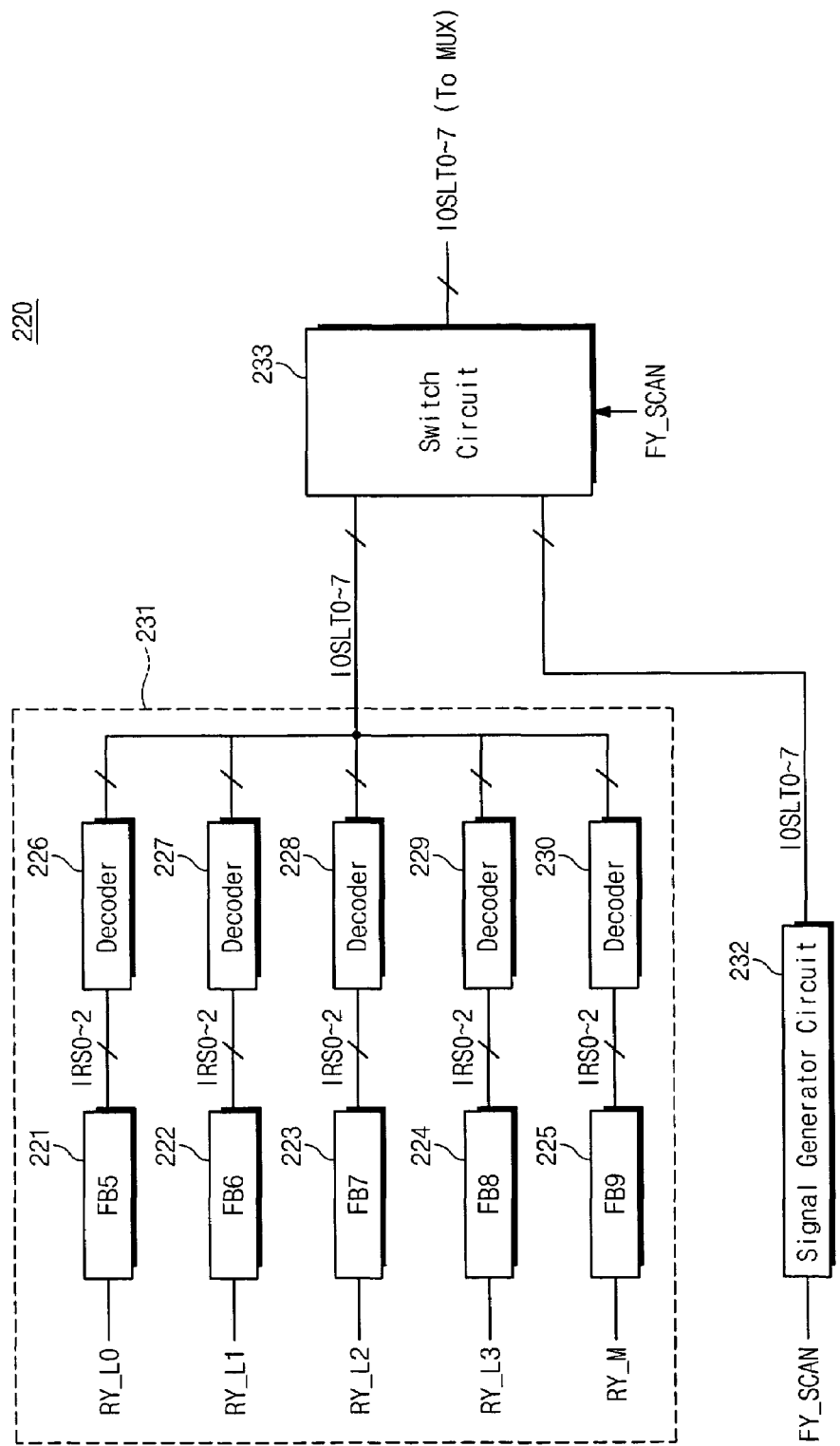
FIG. 12 is a block diagram showing an input/output control circuit in FIG. 1, in accordance with at least one embodiment of the present invention.
Figure 13:
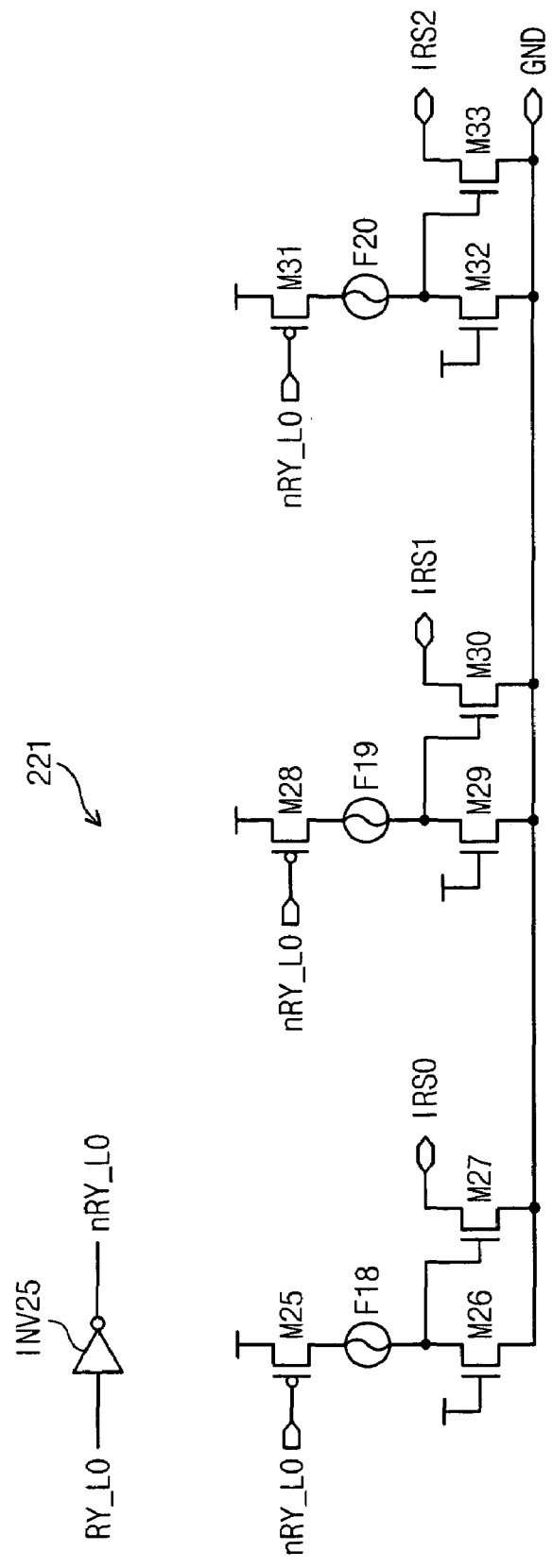
FIG. 13 is a circuit diagram for any one of the fuse boxes in FIG. 12, in accordance with at least one embodiment of the present invention.
Figure 14:
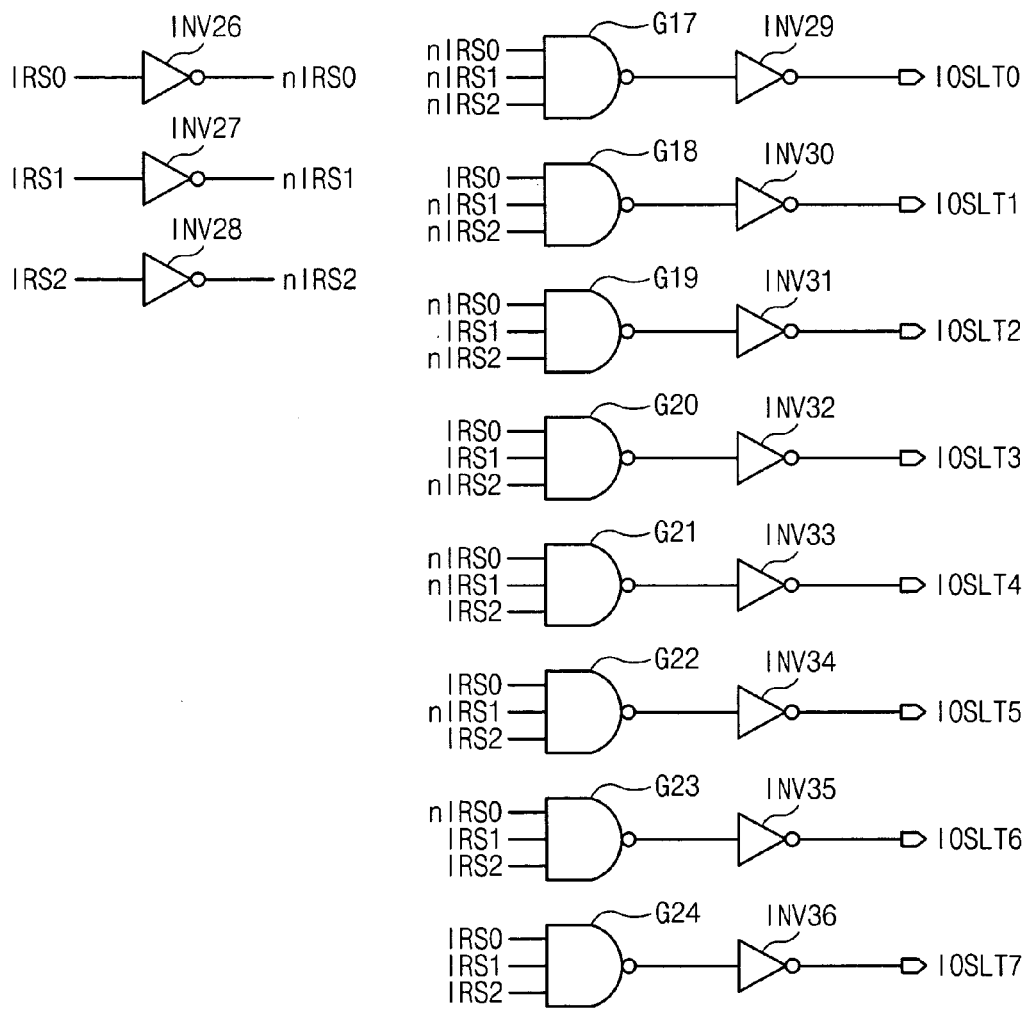
FIG. 14 is a circuit diagram showing any one of decoders in FIG. 12, in accordance with at least one embodiment of the present invention.

FIG. 12 is a block diagram showing the input/output control circuit 220 of FIG. 1, according to at least one embodiment of the present invention. FIG. 13 is a circuit diagram for any one of the fuse boxes FBk of FIG. 12, according to at least one embodiment of the present invention. FIG. 14 is a circuit diagram for any one of the decoders of FIG. 12, according to at least one embodiment of the present invention.

As previously mentioned, when the address XA causes the address of the defective column to be at the output of the counter circuit), the address storage circuit 160 activates the corresponding one of the redundant enable signals RY_L0–RY_L3 and RY_M. The column gate circuit 120R selects one redundant page buffer according to activation of the redundant enable signal RY_Lk. An output of the selected page buffer is commonly supplied to multiplexers 151–158 of the multiplexer circuit 150 as the data RD. Only one of multiplexers 151–158 is controlled to select the redundant data RD depending on control of the input/output control circuit 220. Accordingly, as shown in FIG. 12, the input/output control circuit 220 includes signal generators 231 and 232 and a switch circuit 233. The signal generator 231 includes fuse boxes 221–225 and decoders 226–230. Fuse boxes 221–225 correspond to redundant enable signals RY_L0–RY_L3 and RY_M, respectively. Decoders 226–230 correspond to fuse boxes 221–225, respectively.

Each fuse box 221–225 stores information indicating whether or not any one of the main columns selected by a bite/word unit is defective when a corresponding enable signal is activated. For simplicity, FIG. 13 shows only fuse box 221, though the same can apply to fuse boxes 222–225. The fuse box 221, includes an inverter INV25, a plurality of MOS transistors M25–M33 and three fuses F18, F19 and F20. When the redundant enable signal RY_L0 is activated high, the PMOS transistors M25, M28 and M31 become turned on by the output signal nRY_L0 of the inverter INV25. At this time, a logic state of output signals IRS0, IRS1 and IRS2 may be decided depending on the cutting state of the fuses F18, F19 and F20. The cutting states of the fuses F18–F20 reflect whether or not any of the selected main columns is defective column.

Referring to FIG. 12 again, each decoder 226–230 responds to output signals IRS0–IRS2 of a corresponding fuse box to generate selection signals IOSLT0–IOSLT7. The selection signals IOSLT0–IOSLT7 are transferred through the switch circuit 233 to the multiplexer circuit 150. As shown in FIG. 14, each decoder 226–230 includes a plurality of NAND gates G17–G24 and a plurality of inverters INV29–INV36. Under a first example circumstance, if all input signals IRS0–IRS2 have a logic high level, then the selection signal IOSLT7 becomes logically high, and the rest of selection signals IOSLT0–IOSLT6 become logically low. Accordingly, the multiplexer 158 of FIG. 11 selects the redundant data RD rather than the main data MD7, and the rest of multiplexers 151–157 select the corresponding main data. Under a second example circumstance, if all input signals IRSO–IRS2 have a logic low level, the selection signal IOSLT0 becomes logically high, and the rest of selection signals IOSLT1–IOSLT7 become logically low. Accordingly, under the second circumstance, the multiplexer 151 of FIG. 11 selects the redundant data RD rather than the main data MD0, and the rest of the multiplexers 152–158 select the corresponding main data.

The signal generator 232 responds to activation of a scan flag signal FY_SCAN to generate selection signals IOSLT0–IOSLT7. Logic states of the selection signals IOSLT0–IOSLT7 are programmed in advance. For example, the signal generator circuit 232 may be designed according to the following. The selection signal IOSLT0 can be driven to a high logic level, and the rest of the selection signals IOSLT1–IOSLT7 can be driven to a low logic level, e.g., by the signal line IOSLT0 being connected to the power supply voltage, and the rest of the signal lines IOSLT0–IOSLT7 being connected to the ground voltage. When the scan flag signal FY_SCAN is activated, the switch circuit 233 transfers the output signals IOSLT0–IOSLT7 from the signal generator to the multiplexer circuit 150. Therefore, irrespective of redundancy information, the multiplexer 151 sequentially outputs data from the redundant cell array 100R during a test operation.

Figure 15:
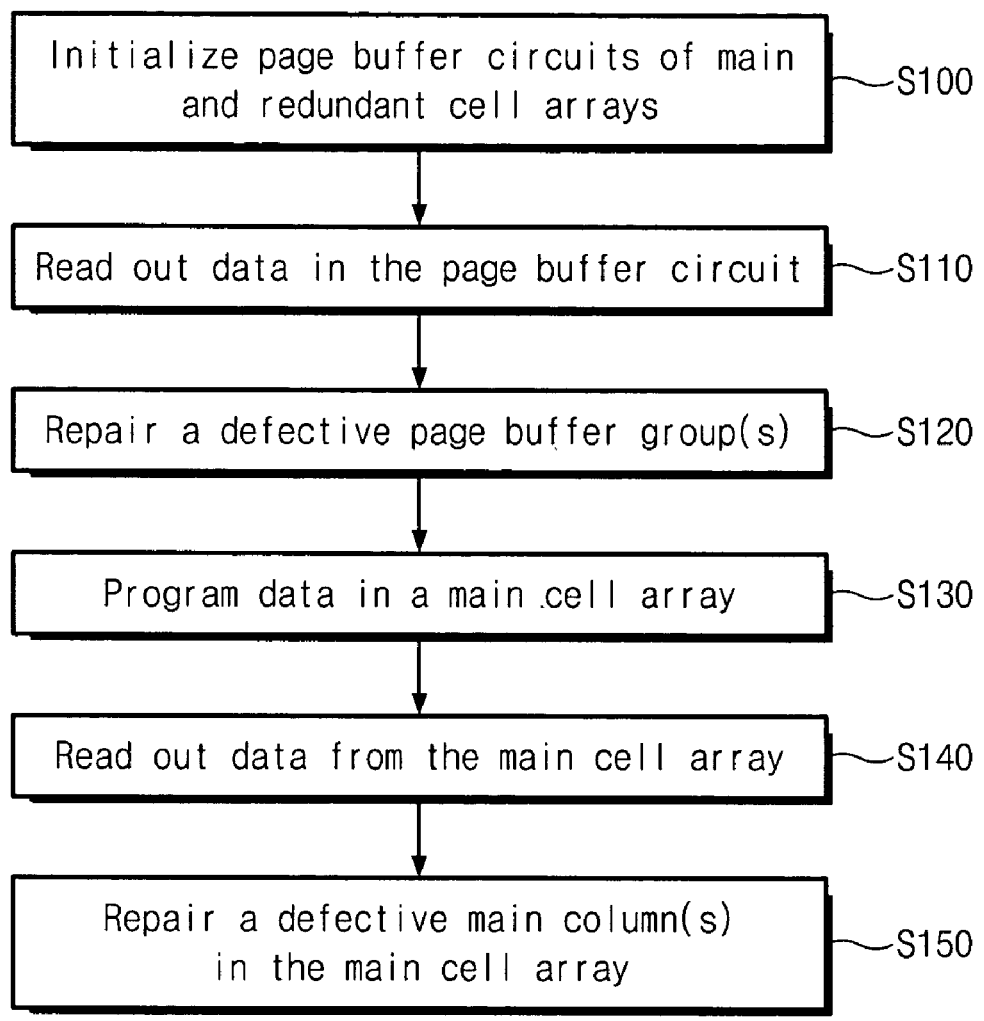
FIG. 15 is a flowchart illustrating repair operation of the flash memory device, in accordance with at least one embodiment of the present invention.

FIG. 15 is a flowchart illustrating a repair operation of the flash memory device 100, according to at least one embodiment of the present invention. The flash memory device 100 can initially decide whether or not a defective page buffer exists in the page buffer circuits 110M and 110R. If so, then the defective page buffer group including the defective page buffer is repaired. Next, the flash memory device 100 can decide whether or not the main columns (or bit lines) of the main cell array 100M include one or more defective main column(s). If a defective main column exists, then the defective main column is substituted for the redundant column.

In more detail, to decide whether or not the flash memory device 100 includes defective page buffer, at first the page buffer circuits are initialized (block S100). For example, the nodes ND1 of all the page buffers in the page buffer circuits 110M and 110R are initialized to a logical value, e.g., "1" (S100). In addition, to initialize page buffers PB in the page buffer circuits 110M and 100R, control signals PLOAD and PBLCH of the page buffer PB are driven to a low level and a high level, respectively. As a result, node ND1 of the latch LAT1 becomes high. At this time, a data line DLk is pre-charged through a PMOS transistor M8 of FIG. 2. If an initialization operation of the page buffer circuits 110M and 110R is finished, then data of the page buffer circuits 110M and 110R may be read and evaluated (block output S110) to decide whether or not a defective page buffer exists.

In advance, a counter circuit 130 sequentially generates an internal address ADD_int according to the loaded address (the initialized address). The main column decoder circuit 140 responds to the internal address ADD_int from the counter circuit 130 to generate selection signals. Therefore, the column gate circuit 120M selects page buffers of the page buffer circuit 110M at the a bite/word granularity. Data of the selected page buffers are transferred through the multiplexer circuit 150 to data lines DLk. At this time, all signals IOSLT0–IOSLT7 for controlling the multiplexers have the logic low level. This indicates that a repair operation has not been carried out. In other words, since the address storage circuit 160 is not programmed, all output signals IOSLT0–IOSLT7 of the signal generator 231 become low. At this time, the switch circuit 233 transfers outputs IOSLYT0–IOSLT7 of the signal generator 231 to the multiplexer circuit 150 before the scan flag signal FY_SCAN is activated. As the internal address ADD_int is sequentially increased, all page buffers in the page buffer circuit 110M sequentially will be selected.

As previously mentioned, the counter circuit 130 is operated until all page buffers of the page buffer circuit 110M are selected in a normal operation mode. However, when the scan flag signal FY_SCAN is activated, the counter circuit 130 is continuously operated until all page buffers of the page buffer circuit 110R have been selected. As the counter circuit 130 is continuously operated, the test decoder circuit 190 outputs selection signals YCR_Lmn and YCR_Mx by decoding the internal address ADD_int from the counter circuit 130. In this case, the selection circuits YCR_Lmn and YCR_Mx are transferred through the switch circuit 180 to the column gate circuit 120R. Pass transistors M15–M30 are sequentially turned on, one by one, by increasing of the internal address, which correspondingly sequentially activates selection signals YCR_Lmn and YCR_Mx of the test decoder. This result is that initialized (or latched) data from all page buffers of the page buffer circuit 110R are sequentially transferred through the column gate circuit 120R of the multiplexer circuit 150.

In a test operation mode in which the data of all page buffers in the page buffer circuits 120M and 120R are inspected, referring to FIG. 12, the switch circuit 233 selects output signals of the signal generator 232 as output signals of the input/output control circuit 220. As previously mentioned, output signals IOSLT0–IOSLT7 of the signal generator 232 have a predetermined value (e.g., "10000000"). In other words, only IOSLT0 signal has a high level, and the rest of signals (IOSLT0–IOSLT7) have a low level. Under this condition, as shown in FIG. 11, data of the page buffers are sequentially outputted in 1-bit units through the column gate circuit 120R and then through the multiplexer 151 to the data line DL0. When data of the page buffer circuit 110R are output through the rest of multiplexers to data lines DL1–DL7, such data will be regarded as invalid data.

According to explanation mentioned previously, all page buffers of page buffer circuits 110M and 110R are initialized, and then the initialized values of the page buffers of page buffer circuits 110M and 110R are selectively read and analyzed. By analyzing the output data (a data pattern of page buffers), page buffer(s) can be sorted. If a defective page buffer(s) is found to exist, then the page buffer group that includes the defective page buffer is replaced with a page buffer group in the page buffer circuit 110R (block S120).

For example, referring to FIG. 3, if the page buffer group PBG0 includes a defective page buffer, then the fuse F0 corresponding to the page buffer group PBG0 is cut, thereby completely preventing the signal on the signal line segment nWD0 from adding to the signal content on the signal line PB_nWD. In other words, in contrast to the Background Art, the defective page buffer group PBG0 can then no longer induce a failure result in the program/erase verification. Next, the address for pointing to the defective page buffer group (again, in the example, PBG0) will be programmed in the address storage block 160B of FIG. 7. If an external entity subsequently attempts to access the address of the defective page buffer group in a normal operation mode, then the corresponding page buffer group in the page buffer circuit 110R rather than the defective page buffer group PBG0 will be selected through the column gate unit (e.g., YG1 of FIG. 1) in the same way as mentioned in the discussion of FIG. 6 and FIG. 10.

When a repair operation of page buffer circuits 110M and 110R is finished, it will be carried out in accordance with whether or not defective column(s) exist(s) in the main cell array 100M. To decide whether a defective column(s) exist(s), at first data (that will be programmed) are loaded in the page buffer circuit 110M. A programming operation is then carried out depending on the type of loaded data (block S130). The programmed data (corresponding to the loaded data) will be accessed via by a read operation (block S140). Program/read operation of the flash memory device 100 has been fully described above, and hence further description is omitted. Whether or not a defective column(s) exist(s) is determined by analyzing the output data. If a defective column(s) exist(s), then the circumstance is adaptively accommodated by storing the address of the defective column(s) in the address storage block 160A (at block S150). As a result, in subsequent normal operation, the redundant column is read instead of (or, in other words, is substituted for) the defective column. Stated differently, during a normal operation mode, the address of the defective column is internally mapped to the redundant column, as mentioned above in the discussion of FIGS. 8, 11 and 12.

As previously mentioned, column gate circuits 120M and 120R, and the multiplexer circuit 150 constitute a data output circuit that selectively outputs data from page buffer circuits 110M and 110R. A control circuit comprises the counter circuit 130, the main column decoder circuit 140, the address storage circuit 160, the redundant column decoder circuit 170, the switch circuit 180, the test decoder circuit 190 and the input/output control circuit 220. The control circuit controls the data output circuit to sequentially output data of page buffers of page buffer circuits 110M and 110R for reading by an external entity in an operation mode by which it is determined whether a page buffer group of page buffer circuits 110M and 110R include a defective page buffer.

Before repairing a defective column, data of the page buffers of the page buffer circuits are scanned to repair the defective page buffer group. As a result, it is possible to determine whether a program/erase failure has been caused by a defective column or a defective page buffer. In addition, by not treating (as would the Background Art) an entire column as being defective when only one of the page buffers is defective (and instead substituting a replacement page buffer for the defective buffer) redundancy effectiveness can be improved.

While the present invention has been described in connection with specific and preferred embodiments thereof, it is capable of various changes and modifications without departing the spirit and scope of the invention. It should be appreciated that the scope of the present invention is not limited to the detailed description of the invention hereinabove, which is intended merely to be illustrative.

What is claimed is:

1. A flash memory device comprising:
   a plurality of main bit lines;
   a plurality of redundant bit lines;
   a plurality of first page buffers respectively organized as a plurality of first page buffer groups which are connected to main bit lines;
   a plurality of second page buffers respectively organized as a plurality of second page buffer groups which are connected to the redundant bit lines;
   each of the first and second page buffers including an output P/F terminal to provide pass/fail data;
   a plurality of fuses corresponding to the pluralities of the first and second page buffer groups, respectively, each of the fuses having one end commonly connected to the P/F terminals in a corresponding page buffer group and the other end connected to a signal line; and
   a pass/fail check circuit to determine an overall pass/fail signal based upon a signal on the signal line.

2. The flash memory device of claim 1, wherein, when at least one of page buffers in each of the first and second page buffer groups is defective, a fuse which corresponds to a page buffer group having the defective page buffer is cut so as to electrically isolate the signal line therefrom.

3. The flash memory device of claim 1, wherein the flash memory device includes an arrangement by which a defective page buffer is repaired without the corresponding column being declared defective.

4. The flash memory device of claim 1, further comprising:
   an address generator circuit for generating an internal address;
   a first selection circuit for selecting the first page buffers in response to the internal address;
   an address storage circuit for storing at least one of an address of a defective main column and an address of a page buffer group having a defective page buffer, the address storage circuit generating redundant enable signals based on whether the internal address is coincident with the stored address in the address storage circuit;
   a second selection circuit for selecting one of the second page buffers as a replacement buffer in response to a part of the internal address when one of the redundant enable signals is activated; and
   a third selection circuit for selecting an output of the replacement page buffer rather than a corresponding one of the first page buffers when one of the redundant enable signals is activated.

5. The flash memory device of claim 4, wherein the address generator circuit generates the internal address so that the second page buffers are sequentially selected when a scan flag signal is activated.

6. The flash memory device of claim 5, wherein, when the scan flag signal is activated, the second selection circuit selects sequentially among the second page buffers one by one irrespective of the redundant enable signals.

7. The flash memory device of claim 5, wherein while a scan flag signal is activated, the third selector circuit outputs output signals of the second page buffers, one by one, which are sequentially selected by the second selector circuit.

8. The flash memory device of claim 4, wherein the second selection circuit comprises:

a redundant column decoder circuit for generating first selection signals in response to the redundant enable signals and a part of the internal address;

a test decoder circuit for generating second selection signals in response to the column address when a scan flag signal is activated;

a switch circuit for selecting either the first selection signals or the second selection signals in response to the scan flag signal; and a column gate circuit for selecting one of the second page buffers in response to output signals of the switch circuit.

9. The flash memory device of claim 8, wherein, while a scan flag signal is inactive, the second page buffers are selected randomly depending on activation of the first selection signals.

10. The flash memory device of claim 8, wherein, while a scan flag signal is activated, the second page buffers are sequentially selected depending on activation of the second selection signals.

11. The flash memory device of claim 4, wherein the third selection circuit comprises:
a first signal generator for generating first input/output selection signals in response to the redundant enable signals;
a second signal generator for generating second input/output selection signals in response to a scan flag signal;
a switch circuit for outputting either the first input/output selection signals or second input/output selection signals in response to the scan flag signal; and
a multiplexer circuit responsive to output signals of the switch circuit, the multiplexer circuit being operable to receive outputs of first page buffers selected by the first selector circuit and an output of a second page buffer selected by the second selector circuit, and select the output of the second page buffer instead of a corresponding one of the outputs of the first page buffers according to signal from the switch circuit.

12. A flash memory device comprising:
a plurality of main bit lines;
a plurality of redundant bit lines;
a plurality of first page buffers respectively organized as a plurality of first page buffer groups which are connected to the main bit lines;
a plurality of second page buffers respectively organized as a plurality of second page buffer groups which are connected to the redundant bit lines;
each of the first and second page buffers including an output P/F terminal to provide pass/fail data;
a plurality of fuses corresponding to the pluralities of the first and second page buffer groups, respectively, each fuse having one end commonly connected to the P/F terminals in a corresponding page buffer group and the other end connected to a signal line;
a pass/fail check circuit to determine an overall pass/fail signal based upon a signal on the signal line;
a data output circuit for outputting data from the first and second page buffer groups; and
a control circuit for controlling the data output circuit so as to sequentially output data from page buffers in the first and second page buffer groups in an mode of operation in which it is judged whether or not the first and second page buffer groups include at least one defective page buffer.

13. The flash memory device of claim 12, wherein when at least one of the page buffers is defective, a fuse corresponding to a page buffer group having the defective page buffer is cut so as to electrically isolate the signal line therefrom.

14. The flash memory device of claim 12, wherein the flash memory device includes an arrangement by which a defective page buffer is repaired without the corresponding column being declared defective.

15. A flash memory device comprising:
a plurality of main bit lines;
a plurality of redundant bit lines;
a plurality of first page buffers respectively organized as a plurality of first page buffer groups which are connected to the main bit lines, respectively;
a plurality of second page buffer groups respectively organized as a plurality of second page buffer groups which are connected to the redundant bit lines;
the first and second page buffers having output P/F terminals for pass/fail data;
a plurality of fuses corresponding to the first and second page buffer groups, respectively, each of the fuses having one and commonly connected to the P/F terminals in a corresponding page buffer group and the other end connected to a signal line;
a pass/fail check circuit to determine an overall pass/fail signal based upon a signal on the signal line;
an address generator circuit for generating an internal address;
a first selection circuit for selecting the first page buffers by a predetermined unit in response to the internal address;
an address storage circuit for storing at least one of an address of a defective main column and an address of a page buffer group having a defective page buffer, the address storage circuit generating redundant enable signals based on whether the internal address is consistent with the stored address;
a second selection circuit for selecting one of the second page buffers as a replacement page buffer in response to a part of the internal address when one of the redundant enable signals is activated; and
a third selection circuit for selecting an output of the replacement page buffer rather than a corresponding one of the selected first page buffers when any one of the redundant enable signals is activated.

16. The flash memory device of claim 15, wherein when a scan flag signal is activated, the address generator circuit generates the internal address so that all page buffers are sequentially selected.

17. The flash memory device of claim 16, wherein while the scan flag signal is activated, the second selection circuit selects sequentially among the second page buffers one by one in response to the internal address irrespective of the redundant enable signals.

18. The flash memory device of claim 16, wherein while the scan flag signal is activated, the third selector circuit outputs signals of the second page buffers, one by one, which are sequentially selected by the second selector circuit.

19. The flash memory device of claim 15, wherein the second selection circuit comprises:
a redundant column decoder circuit for generating first selection signals in response to the redundant enable signals and a part of the internal address;
a test decoder circuit for generating second selection signals in response to the internal address when a scan flag signal is activated;

a switch circuit for selecting either the first selection signals or the second selection signals in response to the scan flag signal; and a column gate circuit for selecting one of the second page buffers in response to output signals of the switch circuit.

20. The flash memory device of claim 19, wherein, while a scan flag signal is inactivated, the second page buffers are selected randomly depending on activation of the first selection signals.

21. The flash memory device of claim 19, wherein, while a scan flag signal is activated, the second page buffers are sequentially selected depending on activation of the second selection signals.

22. The flash memory device of claim 15, wherein the third selection circuit comprises:

a first signal generator for generating first input/output selection signals in response to the redundant enable signals;

a second signal generator for generating second input/output selection signals in response to a scan flag signal;

a switch circuit for outputting either the first input/output selection signals or the second input/output selection signals in response to the scan flag signal; and a multiplexer circuit responsive to output signals of the switch circuit, the multiplexer circuit being operable to receive outputs of first page buffers selected by the first selector circuit and an output of a second page buffer selected by the second selector circuit, and select the output of the second page buffer instead of a corresponding one of the outputs of the first page buffers according to a signal of the switch circuit.

23. The flash memory device of claim 15, wherein when at least one of the page buffers is defective, a fuse corresponding to a page buffer group having the defective page buffer is cut so as to electrically isolate the signal line therefrom.

24. The flash memory device of claim 15, wherein the flash memory device includes an arrangement by which a defective page buffer is repaired without the corresponding column being declared defective.

* * * * *